United States Patent
Ide et al.

(10) Patent No.: US 8,270,127 B2
(45) Date of Patent: Sep. 18, 2012

(54) MAGNETIC COUPLING-TYPE ISOLATOR

(75) Inventors: Yosuke Ide, Niigata-Ken (JP);
Masamichi Saito, Niigata-Ken (JP);
Akira Takahashi, Niigata-Ken (JP);
Masahiro Iizuka, Niigata-Ken (JP);
Yoshihiro Nishiyama, Niigata-Ken (JP);
Hidekazu Kobayashi, Niigata-Ken (JP)

(73) Assignee: Alps Green Devices Co., Ltd., Tokyo (JP)

( * ) Notice: Subject to any disclaimer, the term of this patent is extended or adjusted under 35 U.S.C. 154(b) by 76 days.

(21) Appl. No.: 13/044,493

(22) Filed: Mar. 9, 2011

(65) Prior Publication Data

US 2011/0156798 A1 Jun. 30, 2011

Related U.S. Application Data

(63) Continuation of application No. PCT/JP2009/066359, filed on Sep. 18, 2009.

(30) Foreign Application Priority Data

Sep. 22, 2008 (JP) ................................. 2008-243021

(51) Int. Cl.
*G11B 5/39* (2006.01)
(52) U.S. Cl. ..................................................... 360/324.2
(58) Field of Classification Search ................. 360/324.2
See application file for complete search history.

(56) References Cited

U.S. PATENT DOCUMENTS

| | | | |
|---|---|---|---|
| 4,596,950 A | | 6/1986 | Lienhard et al. |
| 6,872,467 B2 * | | 3/2005 | Qian et al. ..................... 428/611 |
| 7,054,118 B2 * | | 5/2006 | Daughton et al. ......... 360/324.2 |
| 7,660,081 B2 * | | 2/2010 | Daughton et al. ............ 360/324 |
| 2004/0155644 A1 | | 8/2004 | Stauth et al. |
| 2006/0061350 A1 | | 3/2006 | Myers et al. |
| 2007/0165337 A1 * | | 7/2007 | Ide et al. .................... 360/324.2 |
| 2007/0242395 A1 * | | 10/2007 | Bailey ........................ 360/324.2 |
| 2009/0040661 A1 | | 2/2009 | Tanaka et al. |
| 2010/0134944 A1 | | 6/2010 | Yamamoto et al. |

FOREIGN PATENT DOCUMENTS

| | | |
|---|---|---|
| JP | 60-69906 | 4/1985 |
| JP | 64-32712 | 2/1989 |
| JP | 2003-526083 | 9/2003 |
| JP | 2006-514283 | 4/2006 |
| JP | 2007-189039 | 7/2007 |
| WO | 99/45405 | 9/1999 |
| WO | 2008/050790 | 5/2008 |
| WO | 2008/111336 | 9/2008 |

OTHER PUBLICATIONS

Search Report dated Dec. 15, 2009 from International Application PCT/JP2009/066359.

* cited by examiner

*Primary Examiner* — Mark Blouin
(74) *Attorney, Agent, or Firm* — Beyer Law Group LLP

(57) ABSTRACT

Magnetoresistive effect elements R1 to R4 are a TMR element or CPP-GMR element. A multilayer film forming the magnetoresistive effect elements is formed to have a width dimension T1 and a length dimension L1 perpendicular to the width dimension T1. The length dimension L1 is longer than the width dimension T1. The width dimension of magnetic field generators of the coil is T2. The multilayer film 31 is positioned within the width dimension T3 of 60% in total of 30% each to the width dimension T2 of the magnetic field generators 3 and 4 of the coil in the direction towards both sides from the center of the width dimension T2 when seen in a plan view.

6 Claims, 5 Drawing Sheets

MAGNETIC COUPLING-TYPE ISOLATOR

CLAIM OF PRIORITY

This application is a Continuation of International Application No. PCT/JP2009/066359 filed on Sep. 18, 2009, which claims benefit of Japanese Patent Application No. 2008-243021 filed on Sep. 22, 2008. The entire contents of each application noted above are hereby incorporated by reference.

BACKGROUND OF THE INVENTION

1. Field of the Invention

The present invention relates to a magnetic coupling type isolator including a magnetic field generator and a magnetoresistive effect element (TMR element or CPP-GMR element).

2. Description of the Related Art

Inventions regarding a magnetic coupling type isolator are disclosed in Japanese Unexamined Patent Application Publication No. 64-32712, Japanese Unexamined Patent Application Publication No. 60-69906, and PCT Japanese Translation Patent Publication No. 2003-526083. The magnetic coupling type isolator includes a magnetic field generator for converting an input signal into magnetism, and a magnetoresistive effect element for detecting an external magnetic field generated from the magnetic field generator and converting it into an electrical signal. The electrical signal is transmitted to an output side through a signal processing circuit, so that the output is extracted.

A Hall element, an AMR element (anisotropic magnetoresistive effect element), or a GMR element (giant magnetoresistive effect element) is used as the magnetoresistive effect element.

SUMMARY OF THE INVENTION

For example, as shown in the invention disclosed in PCT Japanese Translation Patent Publication No. 2003-526083, it is desirable that the GMR element or the like is formed in a meander shape so as to increase the resistance of the element. In this instance, the GMR element includes a multilayer film having an antiferromagnetic layer, a fixed magnetic layer, a nonmagnetic conductive layer, and a free magnetic layer, and an electrode layer connected to both sides of the multilayer film. In this magnetoresistive effect element, electric current flows in a direction parallel to a film surface of each layer of the multilayer film. Such a magnetoresistive effect element is referred to as a CIP (current in the plane)-GMR element (or simply a GMR element).

However, in the case where the GMR element is formed in the meander shape, there is a problem in that since the element area (area opposite to a coil) of the GMR element is increased, the capacitance between a primary circuit and a secondary circuit (coil and GMR element) is increased.

In addition, there is another problem in that as the element area of the GMR element increases, the coil opposite to the GMR element is difficult to miniaturize, so that the inductance L is increased.

Therefore, it is difficult to improve a signal transmission speed in the related art.

Further, in the case where the GMR element is formed in the meander shape, the size of the coil in a width direction is increased. The magnetic field intensity of the external magnetic field generated from the coil is not uniform. The magnetic field intensity of the external magnetic field is decreased further toward the sides of the coil. Therefore, in the case where the GMR element is formed in the meander shape, there is a problem in that since an external magnetic field of high and almost uniform magnetic field intensity cannot be supplied to the overall GMR element, the output is decreased or the output fluctuates.

As a result, there is a problem in that it is difficult to improve both the output and the signal transmission speed in the related art.

Accordingly, the present invention provides a magnetic coupling type isolator capable of improving output and quickness of response.

According to an embodiment of the present invention, there is provided a magnetic coupling-type isolator including: a magnetic field generator which generates an external magnetic field in response to an input signal; and magnetoresistive effect elements which are disposed opposite to the magnetic field generator in the height direction at positions which are electrically insulated from the magnetic field generator and magnetically coupled with the magnetic field generator, to detect the external magnetic field to convert it into an electrical signal. The magnetoresistive effect elements include a multilayer film and electrode layer disposed on and under the multilayer film, formed by sequentially laminating an antiferromagnetic layer, a fixed magnetic layer, of which the magnetization direction is fixed, a nonmagnetic material layer, and a free magnetic layer of which magnetization is variable. The multilayer film is formed to have a width dimension T1 and a length dimension L1 perpendicular to the width dimension T1, in which the length dimension L1 is longer than the width dimension T1, and the multilayer film is positioned within a width region of 60% in total of 30% each to a width dimension T2 of the magnetic field generator in a direction to both sides from the center of the width dimension T2 when seen in a plan view.

In the embodiment, a TMR element (tunnel magnetoresistive effect element) supplying an electric current in the vertical direction with respect to a film surface of the multilayer film, or a CPP-GMR element is used as the magnetoresistive effect element. According to the magnetoresistive effect elements, it is possible to increase the electric resistance value even though the element length is not extended, like a meander shape of the related art, to increase an element area. Accordingly, it is possible to decrease the element area of the multilayer film forming the magnetoresistive effect elements, as compared with the related art. In this instance, it is required that the width dimension T1 of the multilayer film is set within the width region of 60% of the overall width of the magnetic field generator.

Therefore, the capacitance between a primary circuit and a secondary circuit (the magnetic field generator and the magnetoresistive effect element) can be decreased in comparison with the related art. In addition, since the magnetic field generator can be also formed at a small size due to miniaturization of the magnetoresistive effect elements, it is possible to decrease the inductance L. Since the magnetic coupling type isolator can be miniaturized, the number of the isolators per one wafer is increased, thereby decreasing manufacturing costs.

As described above in the embodiment, in order to effectively generate a shape magnetic anisotropy even though the element area of the multilayer film forming the magnetoresistive effect elements is decreased, the multilayer film is formed to have the length dimension L1 longer than the width dimension T1. Accordingly, it can provide the free magnetic layer with an easy axis of magnetization in the longitudinal direction, thereby improving a linear response to the external magnetic field from the magnetic field generator (hysteresis of R-H curve can be reduced or eliminated). As a result, it is possible to effectively follow the magnetic change of the magnetoresistive effect elements with respect to the change in the external magnetic field from the magnetic field generator due to the input signal of high frequency.

In addition, as described above in the embodiment, the width dimension T1 of the multilayer film is set within the width dimension which is defined by 60% of the overall width of the magnetic field generator (30% of the width each towards both sides from the center) when seen in a plan view. As shown in Test below, the decrease in the magnetic field intensity of the external magnetic field applied to the multilayer film from the magnetic field generator can be suppressed within 10% compared with the maximum value. That is, if the maximum value of the magnetic field intensity of the external magnetic field is 100%, a strong magnetic field intensity of 90% or more can be applied to the overall region of the multilayer film.

With the magnetic coupling type isolator according to the embodiment, high-speed magnetization switching can be achieved, thereby improving the output and the fast response.

It is desirable that the aspect ratio (length dimension L1 to width dimension T1) of the multilayer film is 2 to 30. Therefore, it can provide a shape magnetic anisotropy effectively, thereby improving a linear response to the external magnetic field from the magnetic field generator.

In addition, in the embodiment, it is desirable that the width dimension T1 of the multilayer film is 10 μm or less. Therefore, it can produce the shape magnetic anisotropy effectively, thereby improving the linear response to the external magnetic field from the magnetic field generator.

Further, in the embodiment, it is desirable that the magnetic field generator is a coil being wound in a plane for a number of turns.

Moreover, in the embodiment, it is desirable that the magnetization direction of the fixed magnetic layer faces the width direction of the multilayer film, and is parallel or antiparallel to the direction of the external magnetic field.

In addition, in the present embodiment, it is desirable that the magnetic field generator includes a first magnetic field generator and a second magnetic field generator which generate the external magnetic fields in opposite directions. The magnetoresistive effect element may be disposed opposite to the first magnetic field generator, and the magnetoresistive effect element may be disposed opposite to the second magnetic field generator, in which each of the magnetoresistive effect elements has the same layer configuration. The magnetoresistive effect element disposed opposite to the first magnetic field generator, and the magnetoresistive effect element disposed opposite to the second magnetic field generator may form a bridge circuit.

With the magnetic coupling type isolator according to the present invention, it is possible to improve the output and the quickness of response in comparison with the related art.

DESCRIPTION OF THE PREFERRED EMBODIMENTS

Figure 1:
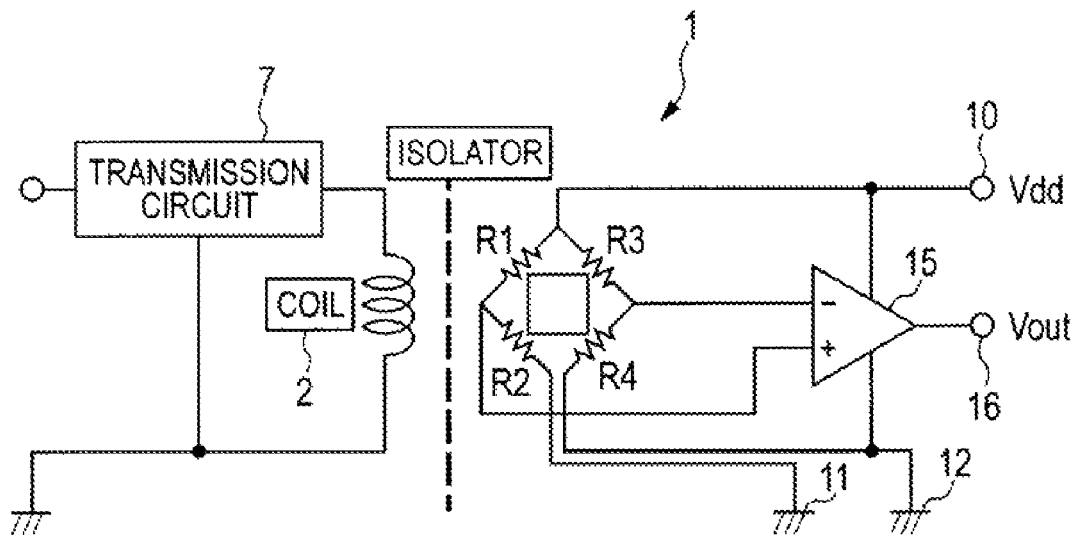
FIG. 1 is a circuit diagram illustrating an overall configuration of a magnetic coupling-type isolator (magnetic coupler) according to an embodiment of the present invention.
Figure 2:
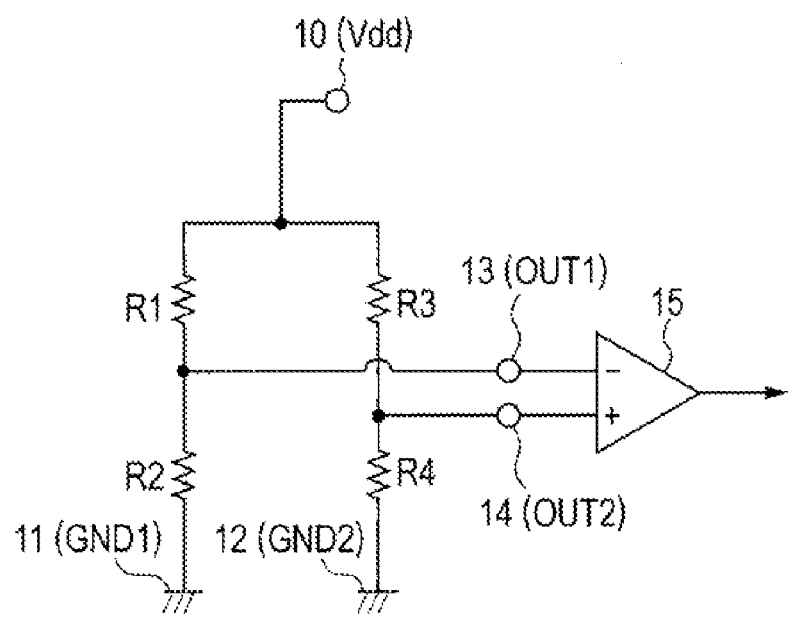
FIG. 2 is a circuit diagram illustrating a bridge circuit including magnetoresistive effect elements.
Figure 3:
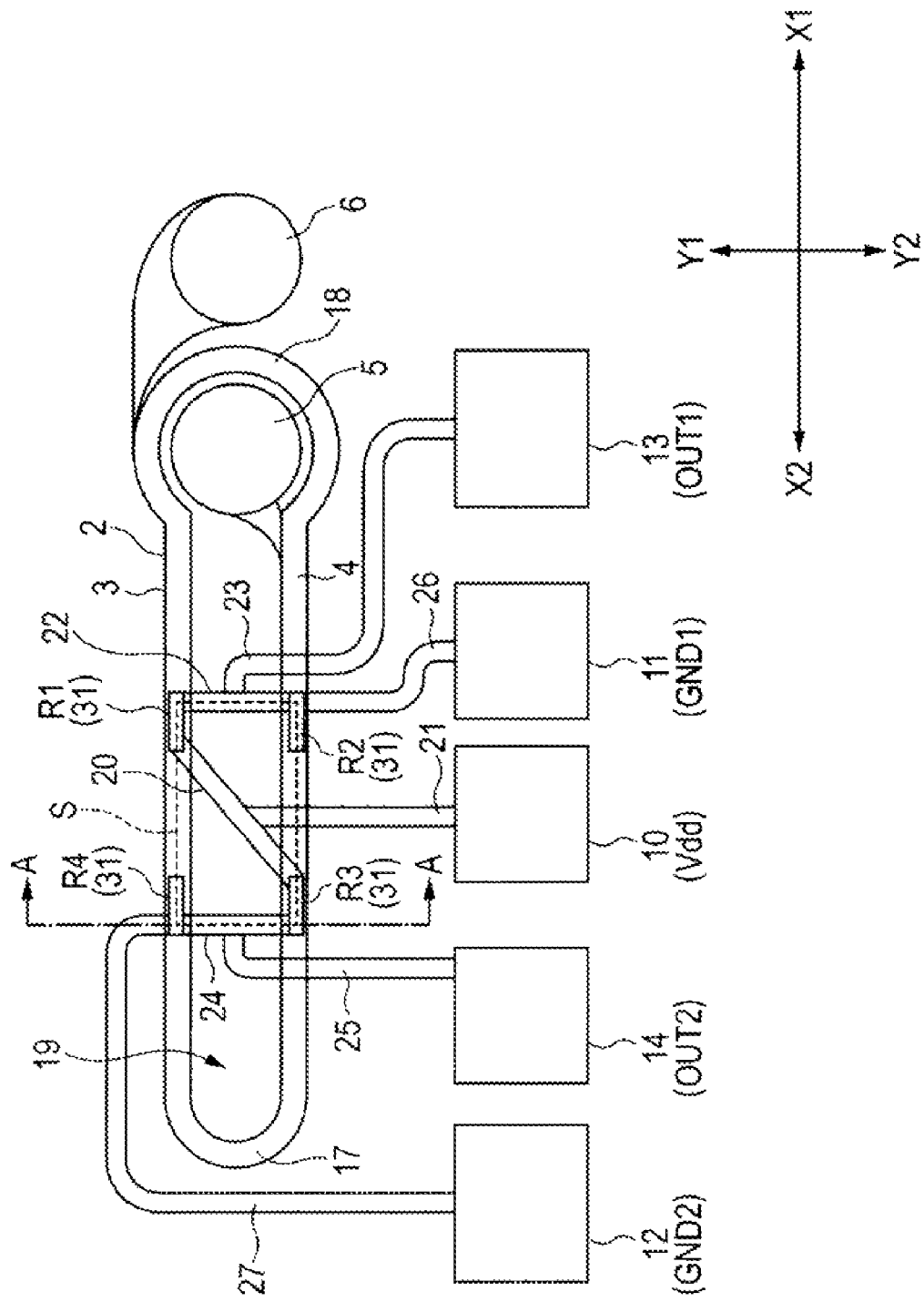
FIG. 3 is a partial plan view illustrating a magnetic coupling-type isolator according to an embodiment of the present invention.
Figure 4:
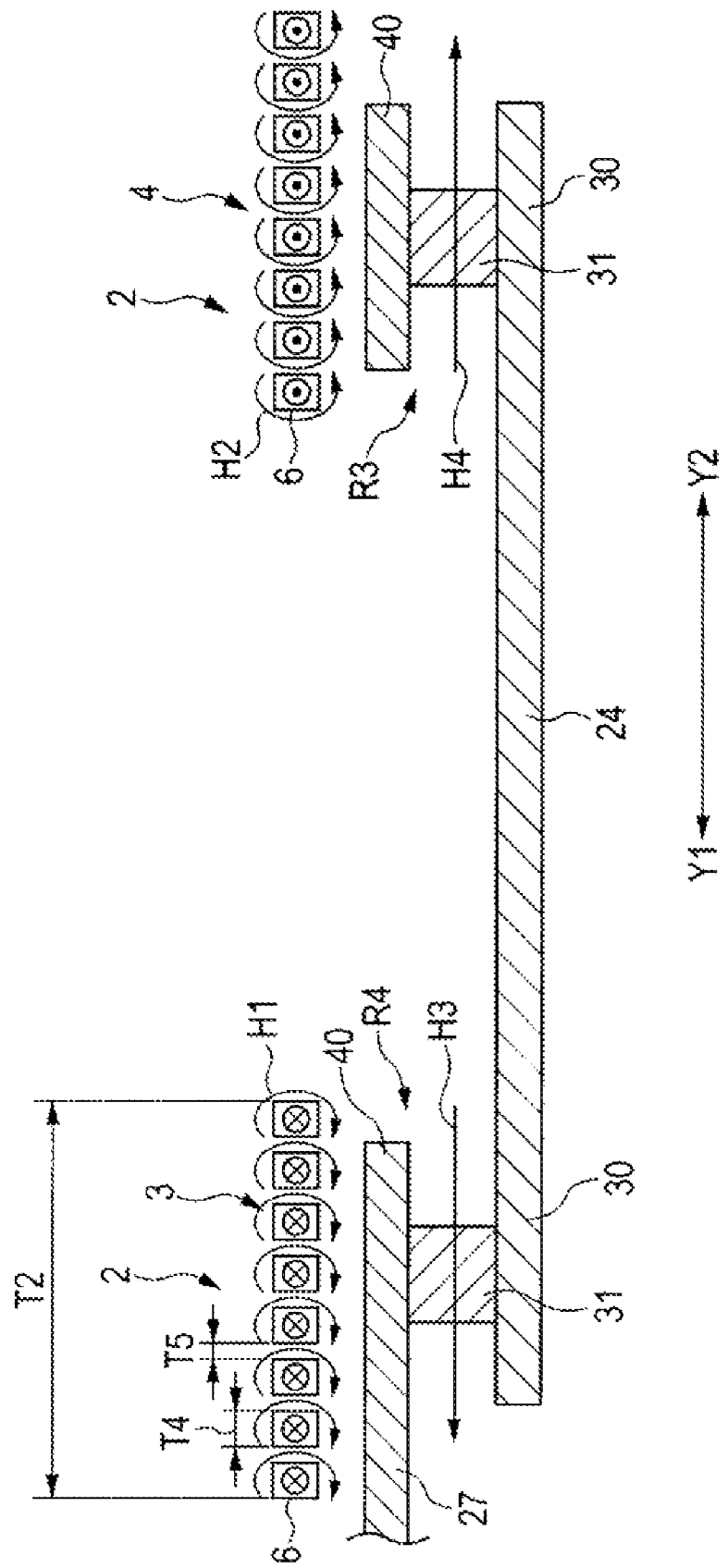
FIG. 4 is a partial cross-sectional view which is cut away in a thickness direction along the line A-A of FIG. 3 and is viewed from the arrow direction.
Figure 5:
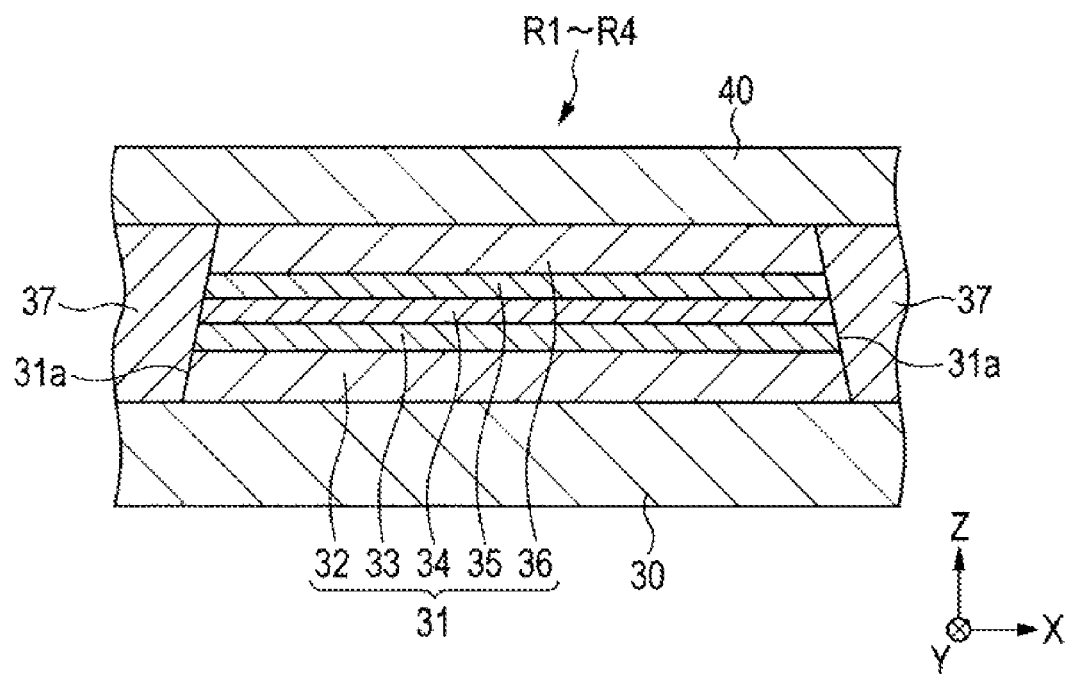
FIG. 5 is a partial cross-sectional view of a TMR element constituting a magnetic coupling-type isolator according to an embodiment.
Figure 6:
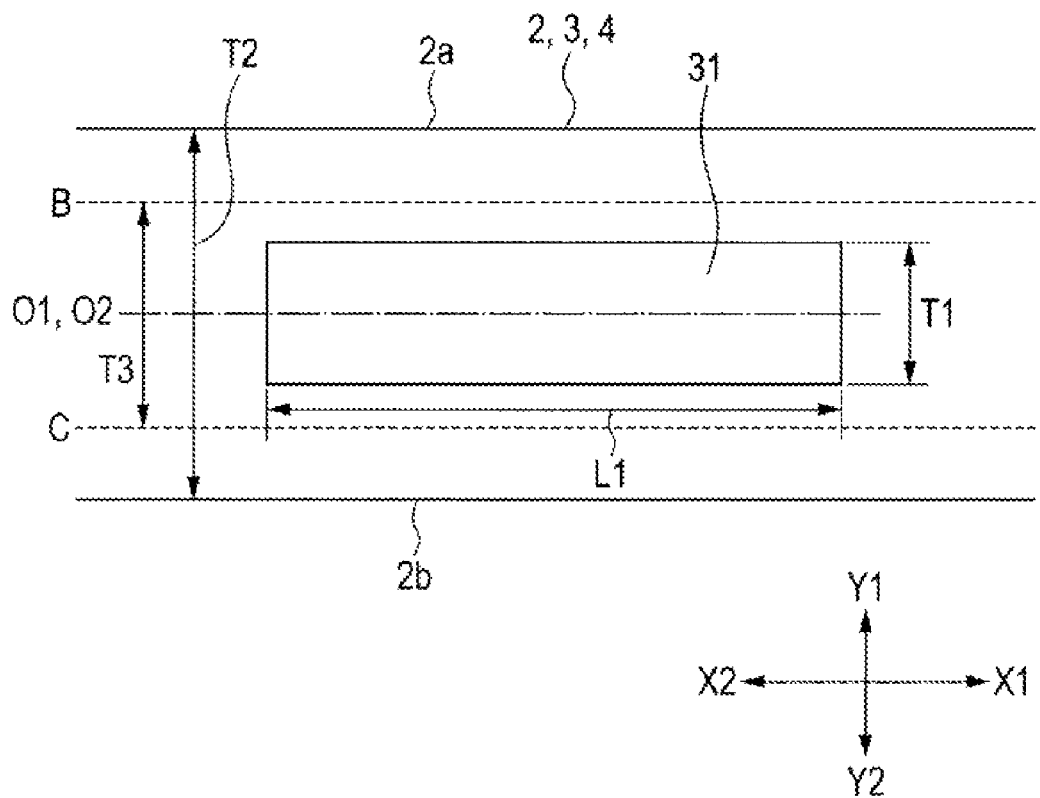
FIG. 6 is a partially enlarged plan view illustrating a multilayer film forming the TMR element, and an enlarged coil opposite to the multilayer film.

FIG. 1 is a circuit diagram illustrating an overall configuration of a magnetic coupling-type isolator (magnetic coupler) according to an embodiment of the present invention. FIG. 2 is a circuit diagram illustrating a bridge circuit including magnetoresistive effect elements R1 to R4. FIG. 3 is a partial plan view illustrating a magnetic coupling-type isolator according to an embodiment of the present invention. FIG. 4 is a partial cross-sectional view which is cut away in a thickness direction along the line A-A of FIG. 3 and is viewed from the arrow direction. FIG. 5 is a partial cross-sectional view of a TMR element constituting the magnetic coupling-type isolator according to an embodiment. FIG. 6 is a partially enlarged plan view illustrating a multilayer film forming the TMR element, and an enlarged coil opposite to the multilayer film. In this instance, while an insulation layer is not shown, and only inner and outer edges of a coil 2 are shown in FIGS. 3 and 6, the magnetoresistive effect elements R1 to R4 underlying the coil 2 are shown by transparency.

As shown in FIG. 1, the magnetic coupling-type isolator 1 includes a coil 2 serving as a magnetic field generator, and the magnetoresistive effect elements R1 to R4. The coil 2 and the respective magnetoresistive effect elements R1 to R4 are electrically insulated by an insulation layer (not illustrated), but they are spaced at an interval capable of obtaining magnetic coupling.

In FIG. 1, a signal processing circuit (IC) such as a differential amplifier 15 or an external output terminal 16 is included in the magnetic coupling-type isolator 1. However, the magnetic coupling-type isolator 1 may include the coil 2, the magnetoresistive effect elements R1 to R4, and each of terminals 10 to 14 shown in FIG. 3 without the signal processing circuit (IC). In this instance, it is necessary to electrically connect the magnetic coupling-type isolator 1 to the signal processing circuit (IC) of an electronic device side.

As shown in FIG. 3, the coil 2 includes a first magnetic field generator 3 and a second magnetic field generator 4 extending in the shape of strap in a direction X1-X2. The first and second magnetic field generators 3 and 4 face each other with an interval in a direction Y1-Y2. The first and second magnetic field generators 3 and 4 are connected to each other by connection portions 17 and 18. The connection portions 17 and 18 are curved in shape, but are not limited thereto. A space portion 19 is surrounded by the first magnetic field generator 3, the second magnetic field generator 4, and connection portions 17 and 18.

As shown in FIG. 4, the coil 2 is formed by winding a plurality of coil pieces 6, having a width dimension T4, spaced at a predetermined interval T5. Therefore, as shown in FIG. 4, the first and second magnetic field generators 3 and 4 include a plurality of coil pieces 6 arranged side by side in the direction Y1-Y2.

Two electrode pads 5 and 6 are connected to the coil 2. The electrode pads 5 and 6 have a circular shape, but are not limited thereto. In addition, the coil 2 is connected to a transmission circuit 7 through the electrode pads 5 and 6 as shown in FIG. 1. When electric current flows based on an input signal from the transmission circuit 7, an external magnetic field is generated from the coil 2. As shown in FIG. 4, a direction of the current flowing through the coil piece 6 of the first magnetic field generator 3 is anti-parallel to the direction of the current flowing through the coil piece 6 of the second magnetic field generator 4. Therefore, an external magnetic field H1 generated by the coil piece 6 of the first magnetic field generator 3 is directed adversely to an external magnetic field H2 generated by the coil piece 6 of the second magnetic field generator 4. As shown in FIGS. 3 and 4, immediately under (or immediately over) the first magnetic field generator 3 and under (or over) the second magnetic field generator 4, the magnetoresistive effect elements R1 to R4 are arranged to face each other with an insulation layer (not illustrated) interposed. The external magnetic field H3 applied to the first and fourth magnetoresistive effect elements R1 and R4, which are arranged to face the first magnetic field generator 3, by the first magnetic field generator 3 is anti-parallel to the external magnetic field H4 applied to the second and third magnetoresistive effect elements R2 and R3, which are arranged to face the second magnetic field generator 4, by the second magnetic field generator 4.

As shown in FIG. 2, the first magnetoresistive effect element R1 is connected in series to the second magnetoresistive effect element R2, and the third magnetoresistive effect element R3 is connected in series to the fourth magnetoresistive effect element R4.

As shown in FIG. 2, the first and third magnetoresistive effect elements R1 and R3 are connected to the input terminal (input pad) 10. According to an embodiment of the invention, the number of input terminals 10 is one.

In addition, the second and fourth magnetoresistive effect elements R2 and R4 are connected to the ground terminals (or ground pads) 11 and 12, respectively. Therefore, according to an embodiment of the invention, the number of ground terminals 11 and 12 is two.

As shown in FIG. 2, the first output terminal 13 (or first output pad OUT1) is connected between the first and second magnetoresistive effect elements R1 and R2. The second output terminal 14 (or second output pad OUT2) is connected between the third and fourth magnetoresistive effect elements R3 and R4.

As shown in FIGS. 1 and 2, the output sides of the first and second output terminals 13 and 14 are connected to a differential amplifier 15.

In addition, as shown in FIG. 1, the output side of the differential amplifier 15 is connected to the external output terminal 16.

As shown in FIG. 3, the first magnetoresistive effect element R1 which is arranged to face the first magnetic field generator 3 of the coil 2 is disposed on the X1 side, and the fourth magnetoresistive effect element R4 is disposed on the X2 side.

In addition, as shown in FIG. 3, the second magnetoresistive effect element R2 which is arranged to face the second magnetic field generator 4 of the coil 2 is disposed on the X1 side, and the third magnetoresistive effect element R3 is disposed on the X2 side.

As shown in FIG. 3, a first wiring pattern 20 is connected between the first and third magnetoresistive effect elements R1 and R3. As shown in FIG. 3, the first wiring pattern 20 is disposed within an enclosed area S rectilinearly enclosed by each element R1 to R4 as seen in a top plan view. The first wiring pattern 20 is slanted when seen from the directions X1-X2 and Y1-Y2.

As shown in FIG. 3, the second wiring pattern 21 is branched from the first wiring pattern 20. The second wiring pattern 21 extends from the inner side of the enclosed area S to the outer side of the enclosed area S and is connected to the input terminal 10.

In addition, as shown in FIG. 3, a third wiring pattern 22 is connected between the first and second magnetoresistive effect elements R1 and R2. The third wiring pattern 22 extends in the direction Y1-Y2. Furthermore, a fourth wiring pattern 23 is branched from the third wiring pattern 22 to the outer side of the enclosed area S. The fourth wiring pattern 23 is connected to the first output terminal 13, as shown in FIG. 3.

As shown in FIG. 3, a fifth wiring pattern 24 is connected between the third and fourth magnetoresistive effect elements R3 and R4. The fifth wiring pattern 24 extends in the direction Y1-Y2. Furthermore, a sixth wiring pattern 25 is branched from the fifth wiring pattern 24 to the outer side of the enclosed area S. The sixth wiring pattern 25 is connected to the second output terminal 14, as shown in FIG. 3.

Furthermore, as shown in FIG. 3, the seventh wiring pattern 26 is connected between the second magnetoresistive effect element R2 and the first ground terminal 11. In addition, an eighth wiring pattern 27 is connected between the fourth magnetoresistive effect element R4 and the second ground terminal 12, as shown in FIG. 3.

As shown in FIG. 3, the terminals 10 to 14 are arranged in a line with a predetermined interval in the direction X1-X2. Therefore, the wiring (i.e., electrical connection) of the terminals to the signal processing circuit (IC) side can be simplified. In the center of the terminals 10 to 14, only one input terminal 10 is disposed.

As shown in FIG. 3, the wiring patterns may be routed so as not to overlap with one another as seen in a top plan view.

However, the shapes of wiring patterns are not limited to those shown in FIG. 3. The overlapped portion may exist between the wiring patterns as seen in a top plan view.

Instead of the embodiment shown in FIG. 3, the ground terminal may be placed in the position of the input terminal 10, and the input terminal may be placed in the position of the ground terminals 11 and 12. In this instance, the number of ground terminals is one, and the number of input terminals is two.

Each of the magnetoresistive effect elements R1 to R4 has the same layer configuration. Each of the magnetoresistive effect elements R1 to R4 is formed by using the structure shown in FIG. 5.

In FIG. 5, reference numeral 30 indicates a lower electrode layer. A multilayer film 31 is formed on the lower electrode layer 30. The multilayer film 31 is formed by sequentially laminating an antiferromagnetic layer 32, a fixed magnetic layer 33, an insulation barrier layer 34, a free magnetic layer 35, and a protection layer 36 from the bottom. The multilayer film 31 may be formed by sequentially laminating the free magnetic layer 35, the insulation barrier layer 34, the fixed magnetic layer 33 and the antiferromagnetic layer 32 from the bottom.

The antiferromagnetic layer 32 is formed of an antiferromagnetic material containing, for example, an element a (including one or more elements selected from a group consisting of Pt, Pd, Ir, Rh, Ru, and Os), and Mn.

A seed layer for aligning crystalline orientations may be provided between the antiferromagnetic layer 32 and the lower electrode layer 30.

The magnetization of the fixed magnetic layer 33 is fixed in a Y-direction shown in the drawing due to an exchange coupling magnetic field (Hex) generated at the interface between the antiferromagnetic layer 32 and the fixed magnetic layer. Here, the term "fixed magnetization" means that the magnetization does not change at least with respect to the external magnetic field applied from the coil 2 to the magnetoresistive effect elements R1 to R4.

In FIG. 5, while the fixed magnetic layer 33 is a single-layered structure containing CoFe or the like, it may be a laminated structure, and particularly, a ferromagnetic laminated structure including a magnetic layer, a nonmagnetic intermediate layer, and a magnetic layer is preferable because the magnetization fixation force of the fixed magnetic layer 33 can increase.

The insulation barrier layer 34 is formed on the fixed magnetic layer 33. The insulation barrier layer 34 is formed of, for example, titanium oxide (Ti—O) or magnesium oxide (Mg—O).

The free magnetic layer 35 is formed on the insulation barrier layer 34. While the free magnetic layer 35 is a single-layered structure in FIG. 5, it may be a laminated structure of a magnetic layer. While the free magnetic layer 35 is a single-layered structure containing NiFe, it is preferably a laminated structure containing NiFe.

The protection layer 36 formed of a nonmagnetic metallic material such as Ta is formed on the free magnetic layer 35.

Both side end surfaces 31a and 31a of the direction X1-X2 (i.e., X-direction) of the multilayer film 31 are formed to be slanted such that the width dimension of the X-direction is gradually narrowed from the bottom to the top. However, both side end surfaces may not be slanted but may be vertically erected.

As shown in FIG. 5, the insulation layer 37 is formed across the side end surfaces 31a and 31a on the lower electrode layer 30. The insulation layer 37 is formed on an existing insulation material such as Al2O3 or SiO2. Furthermore, the upper electrode layer 40 is formed on the insulation layer 37 and the multilayer film 31.

The magnetoresistive effect elements R1 to R4 according to an embodiment of the present invention are TMR elements (tunneling magnetoresistive effect elements). Therefore, the electrode layers 30 and 40 are formed on and under the multilayer film 31. In addition, the electric current flows in the vertical direction with respect to the film surfaces of each layer of the multilayer film 31. Such a magnetoresistive effect element is referred to as a CPP (current perpendicular to the plane) type element. The CPP type element includes the CPP-GMR element in addition to the TMR element. In the CPP-GMR element, a nonmagnetic conductive layer such as Cu is used instead of the insulation barrier layer 34 shown in FIG. 5.

As shown in FIG. 4, the wiring pattern 24 is formed integrally with the lower electrode layer 30. While the wiring pattern 24 may be formed separately from the lower electrode layer 30, the wiring pattern 24 and the lower electrode layer 30 are electrically connected to each other even in this case.

In addition, as shown in FIG. 4, the wiring pattern 27 is formed integrally with the upper electrode layer 40. While the wiring pattern 27 may be formed separately from the upper electrode layer 40, the wiring pattern 27 and the upper electrode layer 40 are electrically connected to each other even in this case.

Since the TMR element includes the electrode layers 30 and 40 formed on and under the multilayer film 31, the wiring pattern connected to the electrode layers 30 and 40 is divided and formed into a plurality of layers.

In this embodiment shown in FIG. 3, while the wiring patterns 20, 21, 26, and 27 are formed in an upper layer, the wiring patterns 22, 23, 24, and 25 are formed in a lower layer, and may be vice versa.

The output of a bridge circuit for the external magnetic field will be described.

For example, if the magnetization of the fixed magnetic layers 33 of the respective magnetoresistive effect elements R1 to R4 is fixed in a direction Y1, and the external magnetic fields H3 and H4 shown in FIG. 4 are applied to the magnetoresistive effect elements R1 to R4, the magnetization of the free magnetic layers 35 of the first and fourth magnetoresistive effect elements R1 and R4 is oriented to the direction Y1. Therefore, the electric resistance values of the first and fourth magnetoresistive effect elements R1 and R4 are reduced. Meanwhile, the magnetization of the second and third magnetoresistive effect elements R2 and R3 is orientated to a direction Y2. Therefore, the electric resistance values of the second and third magnetoresistive effect elements R2 and R3 increase. As a result, a midpoint electric potential between the first and second magnetoresistive effect elements R1 and R2 and a midpoint electric potential between third and fourth magnetoresistive effect elements R3 and R4 change, so that a differential output can be obtained.

As described above, in the magnetic coupling type isolator 1, the electric signal can be transferred from the coil 2 via the magnetoresistive elements R1 to R4.

Each of the magnetoresistive effect elements R1 to R4 shown in FIG. 3 represents a planar shape of the multilayer film 31. As shown in FIG. 3, the multilayer film 31 is formed in a rectangular shape which has long sides in the direction X1-X2 and short sides in the direction Y1-Y2. More specifically, it will be described in detail with reference to FIG. 6 and so forth.

As shown in FIG. 6, the multilayer film 31 forming the TMR element is formed to have a width dimension T1 in the direction Y1-Y2, and a length dimension L1 in the direction X1-X2 perpendicular to the width dimension T1. As shown in FIG. 6, the width dimension T1 is longer than the length dimension L1. While the multilayer film 31 shown in FIG. 6 has a quadrangular shape (rectangular shape), the shape is not limited. For example, the multilayer film may be formed in an oval shape. In this instance, the width dimension T1 and the length dimension L1 are defined as the maximum width dimension and the maximum length dimension.

Meanwhile, the width dimension of the first magnetic field generator 3 and the second magnetic field generator 4 of the coil 2 in the direction Y1-Y2 is formed as T2. The width dimension T2 is calculated by adding a width dimension T4 of each coil 6 to an interval T5 between the respective coil pieces 4, as shown in FIG. 4.

As shown in FIGS. 3, 4 and 6, each of the magnetoresistive effect elements R1 to R4 is disposed opposite to each other so as to overlap with the first magnetic field generator 3 or the second magnetic field generator 4 of the coil 2 when seen in a plan view.

As shown in FIG. 6, T3 is a width dimension of 60% in total of 30% each to the width dimension T2 of the coil 2, that is, a width dimension which is obtained by adding 30% of the width dimension T2 which is set in a direction towards both sides 2a and 2b from a center O1 of the width dimension T2. For example, if the width dimension T2 is 50 µm, the center O1 is positioned at 25 µm inwardly from both sides 2a and 2b. Dotted lines B and C in FIG. 6 are lines which are set by 30% each of the width dimension T2 toward both sides 2a and 2b from the center O1, i.e., 15 µm. A width region between the dotted lines B and C is positioned at the center of the respective magnetic field generators 3 and 4 of the coil 2. In addition, the width dimension T3 of the width region between the dotted lines B and C is 30 µm corresponding to the 60% of the width dimension T2.

In this embodiment, the width dimension T1 of the multilayer film 31 is defined as the width dimension T3 or less such that the multilayer film 31 is set within the range of the width dimension T3.

In the embodiment shown in FIG. 6, the center O2 of the multilayer film 31 in the width direction coincides with the center O1 of the width dimension T2 of the coil 2 when seen in a plan view. However, if the multilayer film 31 is set within the width dimension T3 when seen in a plan view, the center O2 of the multilayer film 31 in the width direction may not coincide with the center O1 of the width dimension T2 of the coil 2. It is desirable that the portion, in which the center O2 of the multilayer film 31 in the width direction coincides with the center O1 of the width dimension T2 of the coil 2 when seen in a plan view, easily acts the external magnetic field of a uniform magnetic field intensity on the overall multilayer film 31.

In this embodiment, a TMR element supplying an electric current in the vertical direction with respect to the film surface of the multilayer film 31, or a CPP-GMR element is used as the magnetoresistive effect elements R1 to R4. According to the magnetoresistive effect elements R1 to R4, it is possible to increase the electric resistance value even though the element length is not extended, like a meander shape of the related art, to increase the element area. Accordingly, it is possible to decrease the element area of the multilayer film 31 forming the magnetoresistive effect elements R1 to R4, as compared with the related art. In this instance, it is required that the width dimension T1 of the multilayer film 31 is set within the width region of 60% of the overall width of the magnetic field generators 3 and 4.

Therefore, the capacitance between a primary circuit and a secondary circuit (the coil 2 and the magnetoresistive effect elements R1 to R4) can be decreased in comparison with the related art. In addition, since the coil 2 can be also formed in a small size due to miniaturization of the magnetoresistive effect elements R1 to R4, it is possible to decrease the inductance L. Since the magnetic coupling type isolator 1 can be miniaturized, the number of the isolators per one wafer is increased, thereby decreasing manufacturing costs.

Figure 7:
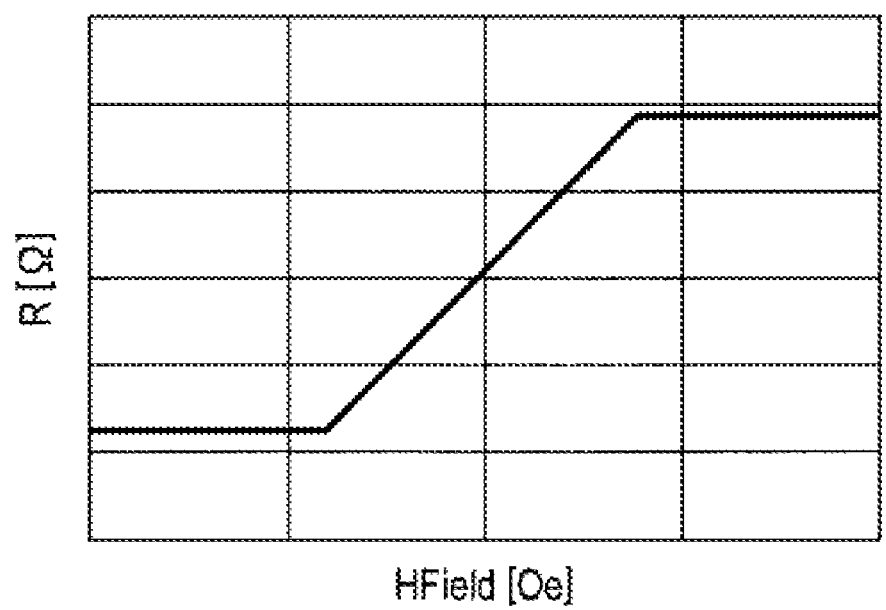
FIG. 7 is a R-H curve of a magnetoresistive effect element according to an embodiment.

As described above in this embodiment, in order to effectively generate a shape magnetic anisotropy even though the element area of the multilayer film 31 forming the magnetoresistive effect elements R1 to R4 is decreased, the length dimension L1 is longer than the width dimension T1. Accordingly, it can provide the free magnetic layer 35 with an easy axis of magnetization in the longitudinal direction (direction X1-X2), thereby improving a linear response to the external magnetic field from the magnetic field generators 3 and 4 (as shown in FIG. 7, hysteresis of R-H curve can be reduced or eliminated). As a result, it is possible to effectively follow the magnetic change of the magnetoresistive effect elements R1 to R4 with respect to the change in the external magnetic field from the magnetic field generators 3 and 4 due to the input signal of high frequency.

In addition, as described above in this embodiment, the width dimension T1 of the multilayer film 31 is set within the width dimension T3 which is defined by 60% of the overall width of the magnetic field generators 3 and 4 (30% of the width each toward both sides from the center O1). As shown in Test below, the decrease in the magnetic field intensity applied to the multilayer film 31 from the magnetic field generators 3 and 4 can be suppressed within 10% compared with the maximum value. That is, if the maximum value of the magnetic field intensity of the external magnetic field is 100%, a strong magnetic field intensity of 90% or more can be applied to the overall region of the multilayer film 31.

With the magnetic coupling type isolator 1 according to the embodiment of the present invention, high-speed magnetization switching can be achieved, thereby improving the output and the fast response.

In this embodiment, it is desirable that the aspect ratio (length dimension L1 to width dimension T1) of the multilayer film 31 is 2 to 30. Therefore, narrowing of the element area can be accelerated, and the shape magnetic anisotropy can be effectively produced, thereby improving the linear response to the external magnetic field from the magnetic field generators 3 and 4.

In addition, in this embodiment, it is desirable that the width dimension T1 of the multilayer film 31 is 10 µm or less. Therefore, the shape magnetic anisotropy can be further effectively produced, thereby improving the linear response to the external magnetic field from the magnetic field generators 3 and 4.

As shown in FIG. 5, while both sides of the multilayer film 31 are filled with the insulation layer 37, the portions may be provided with a hard bias layer (not illustrated) in the state of maintaining the insulation against the multilayer film 31 or the electrode layers 30 and 40. Therefore, a single domain of the free magnetic layer 35 can be further effectively achieved by the bias magnetic field from the hard bias layer, thereby improving the linear response to the external magnetic field.

In addition, the magnetization direction of the fixed magnetic layer 33 faces the width direction (the direction Y1-Y2) of the multilayer film 31 and is parallel or antiparallel to the direction of the external magnetic fields H3 and H4. In a non-magnetic field state (a state in which the external magnetic field is not applied to the free magnetic layer 35), the free magnetic layer 35 is oriented in the longitudinal direction (direction X1-X2) by the shape magnetic anisotropy. That is, the magnetization of the fixed magnetic layer 33 is perpendicular to the magnetization of the free magnetic layer 35 in the non-magnetic field state. Therefore, the output can be increased.

Further, for example, the first magnetoresistive effect element R1 and the fourth magnetoresistive effect element R4 may be a fixed resistance element, but all of the resistance elements forming the bridge circuit can be the magnetoresistive effect elements R1 to R4 to increase the output.

In this embodiment, all of the magnetoresistive effect elements R1 to R4 are formed in the same layer configuration. The term "layer configuration" includes the magnetization direction of the fixed magnetic layer 33, in addition to the laminated order or material. As shown in FIG. 3, the first magnetoresistive effect element R1 and the fourth magnetoresistive effect element R4 are disposed at the position opposite to the first magnetic field generator 3 of the coil 2, and the second magnetoresistive effect element R2 and the third magnetoresistive effect element R3 are disposed at the position opposite to the second magnetic field generator 4. With the wiring shown in FIG. 3, the bridge circuit is configured by the magnetoresistive effect elements R1 to R4. In this embodiment, since all of the magnetoresistive effect elements R1 to R4 are configured by the same layer configuration, it is easy to match the resistance values and the temperature characteristics in all of the magnetoresistive effect elements R1 to R4, and to easily and appropriately form the respective magnetoresistive effect elements R1 to R4. As shown in FIG. 3, the bridge circuit can be simply and appropriately formed by disposing the magnetoresistive effect elements R1 to R4 and the coil 2.

EXAMPLE

A test for the magnetic field intensity was performed as follows.

In the test, the coil 2 was formed to have the width dimension T4 of 4 μm and the interval T5 of 2 μm in the coil piece 6 shown in FIG. 4, in which the number of turns was 8. Accordingly, the width dimension T2 of the magnetic field generators 3 and 4 of the coil 2 was 46 μm.

The magnetic field intensity in the width direction was measured at a position spaced apart from the magnetic field generators 3 and 4 of the coil 2 in the height direction (thickness direction) at an interval of 10 μm. The test result is shown in FIG. 8.

Figure 8:
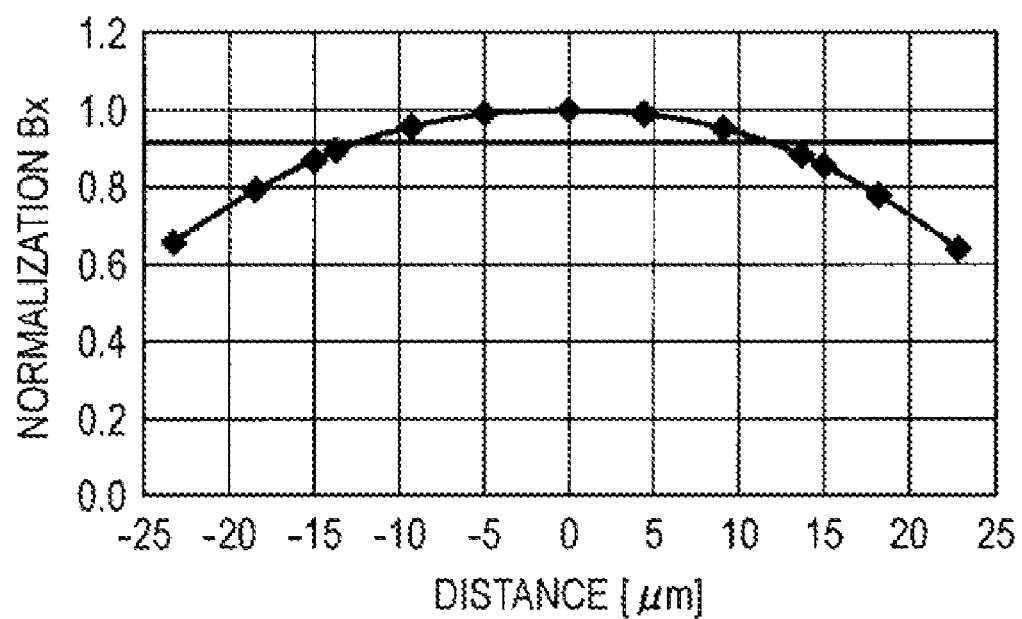
FIG. 8 is a graph illustrating a relationship of a distance from a center of a magnetic field generator of a coil, and a magnetic field intensity (the maximum magnetic field intensity is normalized as 1) of an external magnetic field.

0 μm in the horizontal axis shown in FIG. 8 represents the center O1 of the magnetic field generators 3 and 4 of the coil 2. The magnetic field intensity was the strongest at the center O1, and the maximum value of the magnetic field intensity was normalized as 1.

As shown in FIG. 8, it would be understood that as it is gradually spaced apart from the center O1 to the directions of both sides 2a and 2b (refer to FIG. 6), the magnetic field intensity is gradually decreased.

As shown in FIG. 8, it was understood that a region of a normalized magnetic field intensity=0.9 which is decreased by 10% from the maximum value of the magnetic field intensity is a width region (width region of 60% in total) of 30% exactly to the overall width (width dimension T2=46 μm) towards each of the sides 2a and 2b from the center O1.

Therefore, in this embodiment, the width dimension T1 of the multilayer film 31 is defined as the width dimension T3 or less such that the multilayer film 31 forming the magnetoresistive effect elements R1 to R4 (TMR element or CPP-GMR element) is set within the range of the width dimension T3 of 60% in total of 30% each to the overall width (width dimension T2) of the magnetic field generators 3 and 4 of the coil 2 toward the sides from the center O1 of the width dimension T2.

It should be understood by those skilled in the art that various modifications, combinations, sub-combinations and alterations may occur depending on design requirements and other factors insofar as they are within the scope of the appended claims or the equivalents thereof.

What is claimed is:

1. A magnetic coupling-type isolator comprising:
    a magnetic field generator which generates an external magnetic field in response to an input signal; and
    magnetoresistive effect elements which are disposed opposite to the magnetic field generator in the height direction at positions which are electrically insulated from the magnetic field generator and magnetically coupled with the magnetic field generator, to detect the external magnetic field to convert the detected external magnetic field into an electrical signal,
    wherein the magnetoresistive effect elements include a multilayer film and electrode layers disposed on and under the multilayer film, the multilayer film being formed by sequentially laminating an antiferromagnetic layer, a fixed magnetic layer with a magnetization direction fixed, a nonmagnetic material layer, and a free magnetic layer of which magnetization is variable,
    the multilayer film is formed to have a width dimension T1 and a length dimension L1 perpendicular to the width dimension T1, the length dimension L1 being longer than the width dimension T1,
    the multilayer film is positioned within a width region of 60% in total of 30% each to a width dimension T2 of the magnetic field generator in a direction of both sides from a center of the width dimension T2 when seen in a plan view, and
    a nonmagnetic wiring pattern connected to the magnetoresistive effect element is formed continuous to the electrode layer.

2. The magnetic coupling-type isolator according to claim 1, wherein an aspect ratio (length dimension L1 to width dimension T1) of the multilayer film is 2 to 30.

3. The magnetic coupling-type isolator according to claim 1, wherein the width dimension T1 of the multilayer film is 10 μm or less.

4. The magnetic coupling-type isolator according to claim 1, wherein the magnetic field generator is a coil being wound in a plane for a number of turns.

5. The magnetic coupling-type isolator according to claim 1, wherein the magnetization direction of the fixed magnetic layer faces a width direction of the multilayer film, and is parallel or antiparallel to the a direction of the external magnetic field.

6. The magnetic coupling-type isolator according to claim 1, wherein the magnetic field generator includes a first magnetic field generator and a second magnetic field generator which generate the external magnetic fields in opposite directions,
    the magnetoresistive effect element is disposed opposite to the first magnetic field generator, and the magnetoresistive effect element is disposed opposite to the second magnetic field generator, each of the magnetoresistive effect elements having the same layer configuration, and
    the magnetoresistive effect element disposed opposite to the first magnetic field generator, and the magnetoresistive effect element disposed opposite to the second magnetic field generator form a bridge circuit.

* * * * *